US 6,730,354 B2

(12) United States Patent
Gilbert et al.

(10) Patent No.: US 6,730,354 B2
(45) Date of Patent: May 4, 2004

(54) FORMING FERROELECTRIC PB(ZR,TI)O$_3$ FILMS

(75) Inventors: Stephen R. Gilbert, San Francisco, CA (US); Kaushal Singh, Santa Clara, CA (US); Sanjeev Aggarwal, Plano, TX (US); Stevan Hunter, Fort Collins, CO (US)

(73) Assignees: Agilent Technologies, Inc., Palo Alto, CA (US); Applied Materials, Inc., Santa Clara, CA (US); Texas Instruments, Inc., Dallas, TX (US)

( * ) Notice: Subject to any disclaimer, the term of this patent is extended or adjusted under 35 U.S.C. 154(b) by 161 days.

(21) Appl. No.: 09/925,223

(22) Filed: Aug. 8, 2001

(65) Prior Publication Data
US 2003/0091740 A1 May 15, 2003

(51) Int. Cl.[7] ............................................. C23C 16/40
(52) U.S. Cl. ..................... 427/255.32; 427/255.35; 427/255.36; 427/901
(58) Field of Search .................. 427/255.32, 255.35, 427/255.36, 901

(56) References Cited

U.S. PATENT DOCUMENTS

| 5,527,567 A | 6/1996 | Desu et al. |
| 5,572,052 A | 11/1996 | Kashihara et al. |
| 5,728,603 A | 3/1998 | Emesh et al. |
| 5,876,503 A | 3/1999 | Roeder et al. |
| 6,077,715 A | 6/2000 | Chivukula et al. |
| 6,114,199 A | 9/2000 | Isobe et al. |
| 6,187,072 B1 | 2/2001 | Cheung et al. |
| 6,312,526 B1 * | 11/2001 | Yamamuka et al. ........ 118/720 |
| 6,387,182 B1 * | 5/2002 | Horie et al. ................ 118/244 |

FOREIGN PATENT DOCUMENTS

| WO | WO 99/42282 | 8/1999 |
| WO | 99/42282 | * 8/1999 |
| WO | WO 00/49646 | 8/2000 |
| WO | 00/49646 | * 8/2000 |

* cited by examiner

Primary Examiner—Timothy Meeks

(57) ABSTRACT

Improved methods of forming PZT thin films that are compatible with industry-standard chemical vapor deposition production techniques are described. These methods enable PZT thin films having thicknesses of 70 nm or less to be fabricated with high within-wafer uniformity, high throughput and at a relatively low deposition temperature. In one aspect, a source reagent solution comprising a mixture of a lead precursor, a titanium precursor and a zirconium precursor in a solvent medium is provided. The source reagent solution is vaporized to form a precursor vapor. The precursor vapor is introduced into a chemical vapor deposition chamber containing the substrate. In another aspect, before deposition, the substrate is preheated during a preheating period. After the preheating period, the substrate is disposed on a heated susceptor during a heating period, after which a PZT film is formed on the heated substrate.

28 Claims, 6 Drawing Sheets

(a) ampoule 28 source reagent solution
(b) ampoule 30 source reagent solution

FORMING FERROELECTRIC PB(ZR,TI)O$_3$ FILMS

TECHNICAL FIELD

This invention relates to systems and methods of forming ferroelectric Pb(Zr,Ti)O$_3$ (PZT) films, including ferroelectric PZT films for use in ferroelectric random access memory devices.

BACKGROUND

Today, several trends exist in the semiconductor device fabrication industry and the electronics industry that are driving the development of new material technologies. First, devices are continuously getting smaller and smaller and requiring less and less power. A reason for this is that more personal devices are being fabricated which are very small and portable, thereby relying on a small battery as its supply source. For example, cellular-phones, personal computing devices, and personal sound systems are devices that are in great demand in the consumer market. Second, in addition to being smaller and more portable, personal devices are requiring more computational power and on-chip memory. In light of these trends, there is a need in the industry to provide a computational device that has a fair amount of memory and logic functions integrated onto the same semiconductor chip. Preferably, this computation device will include a non-volatile memory so that if the battery dies, the contents of the memory will be retained. Examples of conventional non-volatile memories include electrically erasable, programmable read only memories and flash EEPROMs.

A ferroelectric memory (FeRAM) is a non-volatile memory that utilizes a ferroelectric material as a capacitor dielectric situated between a bottom electrode and a top electrode. Ferroelectric materials, such as SrBi$_2$Ta$_2$O$_9$ (SBT) and Pb(Zr,Ti)O$_3$ (PZT), are being used in the fabrication of a wide variety of memory elements, including ferroelectric random access memory (FeRAM) devices. In general, ferroelectric memory elements are non-volatile because of the bistable polarization state of the material. In addition, ferroelectric memory elements may be programmed with relatively low voltages (e.g., less than 5 volts) and are characterized by relatively fast access times (e.g., less than 40 nanoseconds) and operational robustness over a large number of read and write cycles. These memory elements also consume relatively low power, may be densely packed, and exhibit radiation hardness.

Recent efforts to develop fabrication processes for ferroelectric materials have focused on integrating FeRAM technology with semiconductor integrated circuit technology. Accordingly, such efforts have focused on scaling FeRAM capacitor areas, cell sizes and operating voltages downward in accordance with the scale of current integrated circuit dimensions. In addition to small lateral dimensions (i.e., dimensions parallel to the film surface), the ferroelectric dielectric must be relatively thin and must have a relatively low coercive field to achieve FeRAM devices having low operating voltages.

Recently, PZT has been demonstrated to be scalable to relatively small lateral dimensions and low operating voltages. For example, International Patent Publication No. WO 00/49646 discloses a process for forming a scalable PZT material by liquid delivery metalorganic chemical vapor deposition (MOCVD) without PZT film modification techniques, such as acceptor doping or use of film modifiers (e.g., Nb, Ta, La, Sr, Ca, and the like). In accordance with this process, liquid precursor solutions of the component metals are mixed and flash vaporized. The resulting source reagent vapor is introduced into a chemical vapor deposition chamber where the PZT film is deposited on a substrate. In one embodiment, the metalorganic precursors are lead bis (2,2,6,6-tetramethyl-3,5-heptanedionate) (hereinafter "Pb(thd)$_2$") as a Pb precursor, titanium bis(isopropoxide)bis(2,2,6,6-tetramethyl-3,5-heptanedionate) (hereinafter "Ti(O-i-Pr)$_2$(thd)$_2$") as a Ti precursor, and zirconium tetrakis(2,2,6,6-tetramethyl-3,5-heptanedionate) (hereinafter "Zr(thd)$_4$") as a Zr precursor In another embodiment, the lead precursor is lead bis(2,2,6,6-tetramethyl-3,5-heptanedionate) N, N', N"-pentamethyl diethylenetriamine (hereinafter "Pb(thd)$_2$pmdeta") and the zirconium precursor is zirconium bis (isopropoxide)bis(2,2,6.6-tetramethyl-3,5-heptanedionate) (hereinafter "Zr(O-i-Pr)$_2$(thd)$_2$"). The solvent media used in the liquid delivery MOCVD process is selected to be compatible with the specific metalorganic precursors used for forming the PZT thin film materials and efficacious in the constituent liquid delivery and CVD process steps. Illustrative multi-component solvent compositions include: tetrahydrofuran: isopropanol: tetraglyme in a 8:2:1 volume ratio; octane: decane: polyamine in a 5:4:1 volume ratio; and octane: polyamine in a 9:1 volume ratio. According to the WO 00/49646 patent publication, the resulting PZT material is pulse length scalable or E-field scalable, or both, and is useful for ferroelectric capacitors having dielectric thicknesses that range from about 20 nanometers to about 150 nanometers and having lateral dimensions that extend down to as small as 0.15 micrometers.

Chemical vapor deposition (CVD) is a particularly attractive method for forming thin PZT films because CVD is readily scaled up to production runs and because CVD technology is sufficiently mature and developed that CVD may be applied readily to new film processes. In general, CVD requires that the element source reagents (i.e., the precursor compounds and complexes containing the elements or components of interest) must be sufficiently volatile to permit gas phase transport into the chemical vapor deposition reactor. The elemental component source reagents should decompose in the CVD reactor for deposition on the desired substrate surface at the desired growth temperatures. Premature gas phase reactions leading to particulate formation should be avoided. In addition, the source reagents should not decompose in the transport lines before reaching the reactor deposition chamber. In sum, in order to deposit CVD films having desirable properties, the stoichiometry and other process conditions must be controlled for a given baseline chemistry to create a transport window that enables component materials to combine on a substrate in a desired way.

SUMMARY

The invention features improved methods of forming PZT thin films that are compatible with industry-standard chemical vapor deposition production techniques. The invention enables PZT thin films having thicknesses of 70 nm or less to be fabricated with high within-wafer uniformity, high throughput and at a relatively low deposition temperature.

In one aspect, the invention features a method of forming a ferroelectric PZT film on a substrate. In accordance with this method, a premixed source reagent solution comprising a mixture of a lead precursor, a titanium precursor and a zirconium precursor in a solvent medium is provided. The source reagent solution is vaporized to form a precursor vapor. The precursor vapor is introduced into a chemical vapor deposition chamber containing the substrate.

Embodiments of the invention may include one or more of the following features.

The zirconium precursor preferably comprises $Zr(OiPr)_2(thd)_2$ or $Zr(thd)_4$ or $Zr(O^tBu)_2(thd)_2$. In one embodiment, the lead precursor is $Pb(thd)_2(pmdeta)$, the zirconium precursor is $Zr(OiPr)_2(thd)_2$, and the titanium precursor is $Ti(OiPr)_2(thd)_2$. The lead precursor, the titanium precursor and the zirconium precursor preferably have a combined concentration between about 0.05 M and about 1.0 M in solution. The source reagent solution preferably is characterized by lead, zirconium and titanium concentrations between about 5% and 95%.

In some embodiments, an oxidizing co-reactant gas comprising 5–100% $N_2O$ and, more preferably 50–75% $N_2O$, is introduced into the chemical vapor deposition chamber. The oxidizing co-reactant gas also may include $O_2$ or $O_3$, or both.

In some embodiments, a second source reagent solution comprising a second premixed mixture of the lead precursor, the titanium precursor and the zirconium precursor in the solvent medium is provided. The first source reagent mixture preferably is different from the second source reagent mixture. The first and second reagent solutions are mixed to form a precursor solution, and the precursor solution is vaporized to form the precursor vapor. In one embodiment, the first and second source reagent solutions preferably are characterized by a lead concentration in a range of about 28–65%, a zirconium concentration in a range of about 14–29%, and a titanium concentration in a range of about 20–43%.

The solvent medium preferably comprises an octane-based solvent.

The source reagent solution may be vaporized at a temperature in the range of about 180–210° C. During deposition, the chemical vapor deposition chamber preferably is maintained at a pressure in a range of about 0.5–10 torr and, more preferably, in a range of about 0.5–4 torr and, still more preferably, at a pressure of approximately 4 torr. The source reagent solution preferably is selected to obtain a precursor vapor having a $Zr/(Zr+Ti)$ ratio in the range of about 0.05–0.70 and a $Pb/(Zr+Ti)$ ratio in the range of about 0.3–3.0.

The substrate preferably is preheated during a preheating period prior to disposing the substrate on the susceptor. The preheating period may be about 5–30 seconds long. The preheated substrate may be deposited on a heated susceptor during a heating period prior to formation of the PZT film on the substrate. The heating period may be about 30–60 seconds long or longer. A flow of a purge gas may be provided to reduce film depositions on the susceptor and chamber wall surfaces. In some embodiments, in addition to the purge gas flow, the pre-heating and heating process steps may be performed in a gas flow that includes a combination of one or more of the following gases: $O_2$, $N_2O$, $O_3$, and an inert gas (e.g., He, $N_2$, or Ar).

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
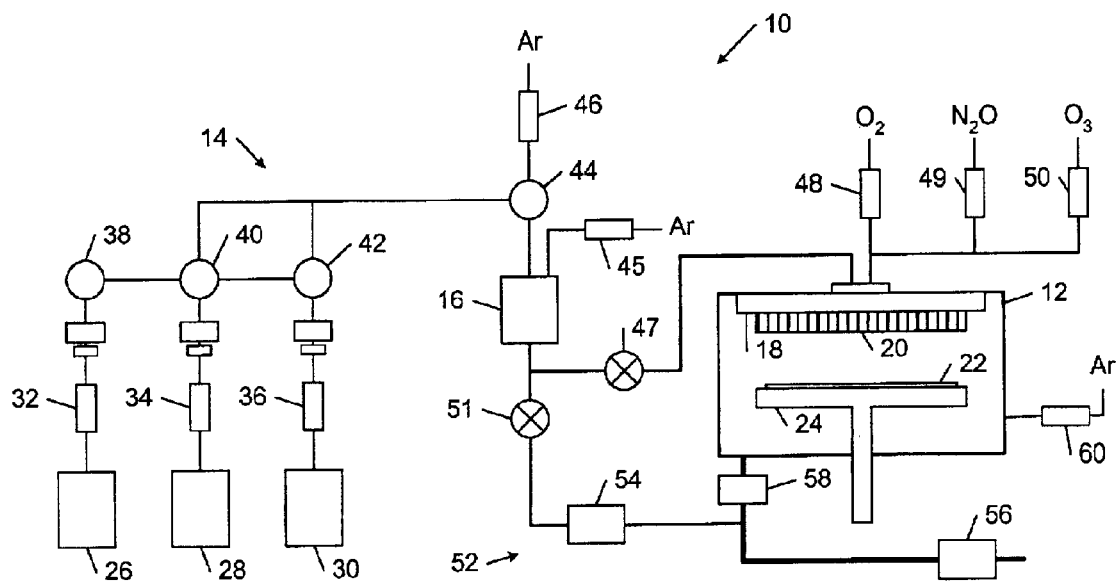
FIG. 1 is a diagrammatic representation of a chemical vapor deposition system for forming PZT films.

Referring to FIG. 1, in one embodiment, a system 10 for forming PZT films by liquid delivery metalorganic chemical vapor deposition includes a chemical vapor deposition (CVD) chamber 12 that is coupled to a dual precursor ampoule liquid delivery system 14 and a single vaporizer 16. CVD chamber 12 may be a 200 mm MOCVD Giga-Cap™ chamber, which is available from Applied Materials, Inc. of Santa Clara, Calif., U.S.A. CVD chamber 12 includes a gas distribution manifold 18 and a showerhead 20 that is configured to introduce PZT precursor vapor into CVD chamber 12 from which a PZT film may be formed on an exposed surface of a substrate 22, which is supported on a heated susceptor 24. In one embodiment, the spacing between showerhead 20 and susceptor 24 is approximately 7.5–10 mm, and preferably is approximately 8.9 mm. The exposed surface of substrate 22 may correspond to the top surface of a silicon wafer, a layer of silicon dioxide formed on a silicon wafer, gallium arsenide, magnesium oxide, sapphire, or the top surface of a multilayer structure that includes, for example, a complex integrated circuit that is formed on a semiconductor wafer. In one embodiment, substrate 22 includes a multilayer bottom electrode structure of Ir (100 nm)/TiAlN (100 nm)/Si$_3$N$_4$/SiO$_2$ that is formed on a silicon wafer. In another embodiment, substrate 22 includes a multilayer bottom electrode structure of IrO$_x$ (50 nm)/Ir (50 nm)/TiAlN (100 nm)/Si$_3$N$_4$/SiO$_2$ that is formed on a silicon wafer.

Liquid delivery system 14 includes a solvent ampoule 26 and a pair of source reagent ampoules 28, 30 containing respective metalorganic mixtures of the component metals needed to form PZT films. Solvent and source reagent ampoules 26–30 are coupled to respective liquid flow controllers 32, 34, 36, which are configured to meter precise quantities of fluid into an equal number of manifolds 38, 40, 42. The metered solvent and metalorganic mixtures are delivered to a final mixing chamber 44 where they are mixed to form a liquid PZT precursor composition. The liquid PZT precursor composition is introduced into vaporizer 16 where the liquid is vaporized, for example, by flash vaporization on a vaporization element (e.g., a porous frit element or a wire grid) that is heated to a suitable temperature to form a precursor vapor. A gas flow controller 46 controls the flow of a carrier gas (e.g., argon gas or helium gas), which transports the precursor vapor into CVD chamber 12 through a valve 47. An additional push gas source (e.g., argon or helium) also may be connected directly to vaporizer 16 through a gas flow controller 45. Gas flow controllers 48, 49, 50 meter precise quantities of oxidizing co-reactant gases (e.g., O$_2$, O$_3$, N$_2$O, or a combination of one or more of these gases) into gas distribution manifold 18, where the oxidizing gases mix with the precursor vapor before being introduced into CVD chamber 12.

Figure 2:
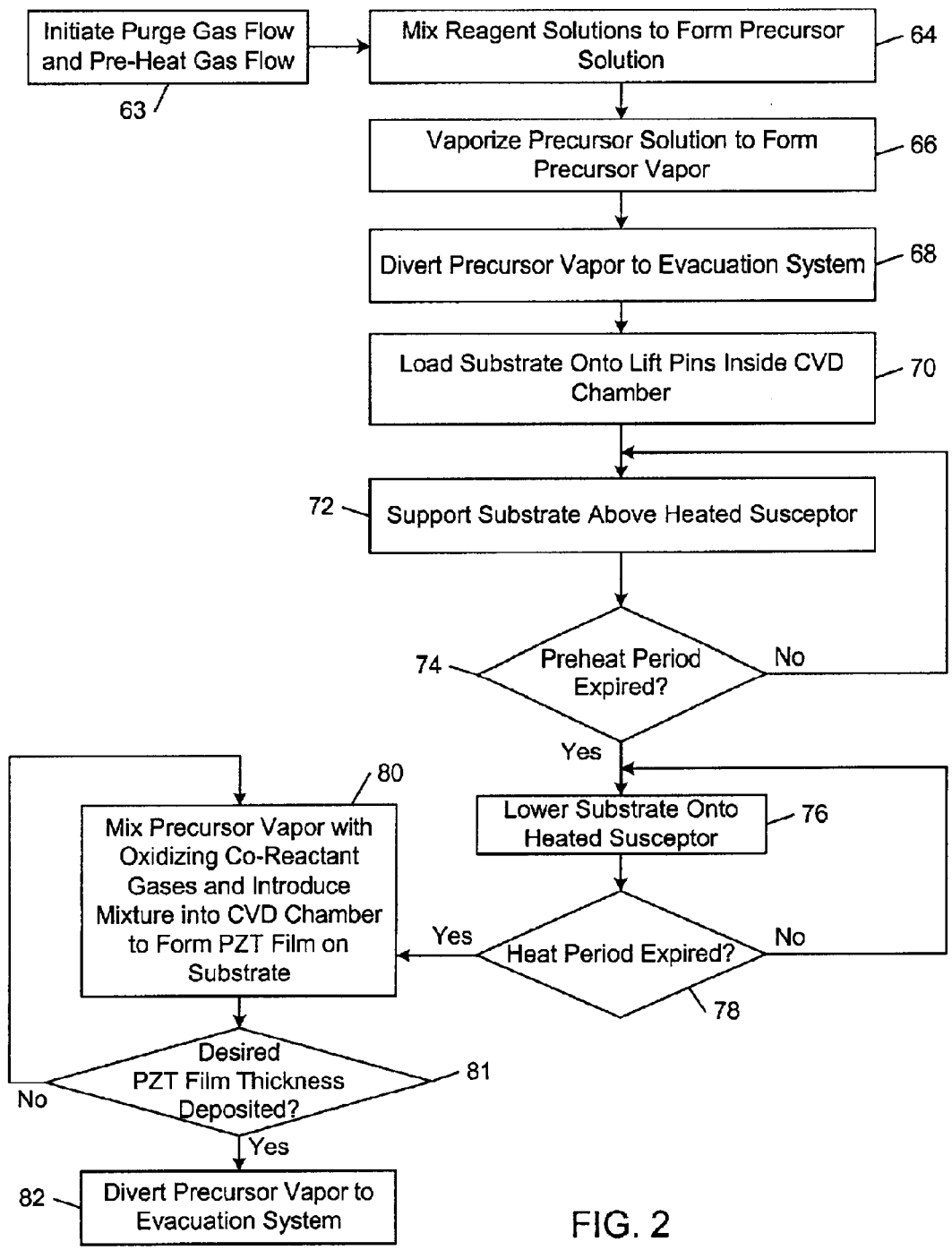
FIG. 2 is a flow diagram of a method of forming PZT films.

Referring to FIGS. 1, 2, 3, 4A, 4B and 5, and initially to FIGS. 1 and 2, a PZT film may be formed on substrate 22 as follows.

During a PZT deposition, a gas flow controller 60 introduces a flow of a purge gas (e.g., argon gas or helium) into CVD chamber 12 to reduce film depositions on the inner wall surfaces of CVD chamber 12 and susceptor 24 (step 63). In one embodiment, the purge gas flow rate is about 250 sccm. During the PZT deposition, the purge gas flow assists in the removal of unconsumed gas molecules, partially reacted compounds and reactive byproducts from CVD chamber 12 through a valve 51, which is coupled to an evacuation system (or "vacuum foreline") 52. Evacuation system 52 includes several cold traps 54, 56 and 58.

The solvent and metalorganic mixtures contained in ampoules 26–30 are mixed to form a PZT precursor solution (step 64). As mentioned above, source reagent ampoules 28, 30 contain different premixed, concentrated solutions of a lead precursor, a titanium precursor and a zirconium precursor in a solvent medium. In one embodiment, the lead precursor is Pb(thd)$_2$(pmdeta), the zirconium precursor is Zr(OiPr)$_2$(thd)$_2$, and the titanium precursor is Ti(OiPr)$_2$(thd)$_2$. The solvent preferably is an octane-based solvent (e.g., a "G" solvent containing an octane:decane:polyamine mixture in a volume ratio of 5:4:1 and available from Applied Technology Materials, Inc. of Danbury, Conn. U.S.A). Other embodiments may include mixtures of different Pb, Zr and Ti precursors and solvent systems. In general, the precursors should exhibit good ambient stability, high volatility and good thermal compatibility. For example, in some embodiments, the Zr(OiPr)$_2$(thd)$_2$ zirconium precursor may be replaced by Zr(OiPr)$_6$(thd)$_2$ or Zr(thd)$_4$ or Zr(O$^t$Bu)$_2$(thd)$_2$. Each of these precursors is available from Applied Technology Materials, Inc. of Danbury, Conn. U.S.A.

It has been found that the use of premixed solutions that contain each of the metal precursors enhances the run-to-run repeatability and the throughput of the PZT film forming process relative to processes in which elemental precursors or incomplete precursor mixtures are used. The use of such complete precursor mixtures also enables the use of a single vaporizer, which simplifies the system design. In addition, the use of two such complete precursor mixtures allows the size of the composition space from which precursor solutions may be formed to be reduced substantially, further improving the repeatability of the process while providing sufficient flexibility for process designers to optimize the baseline chemistry to achieve a desired film composition for a given set of process parameters.

Figure 3:
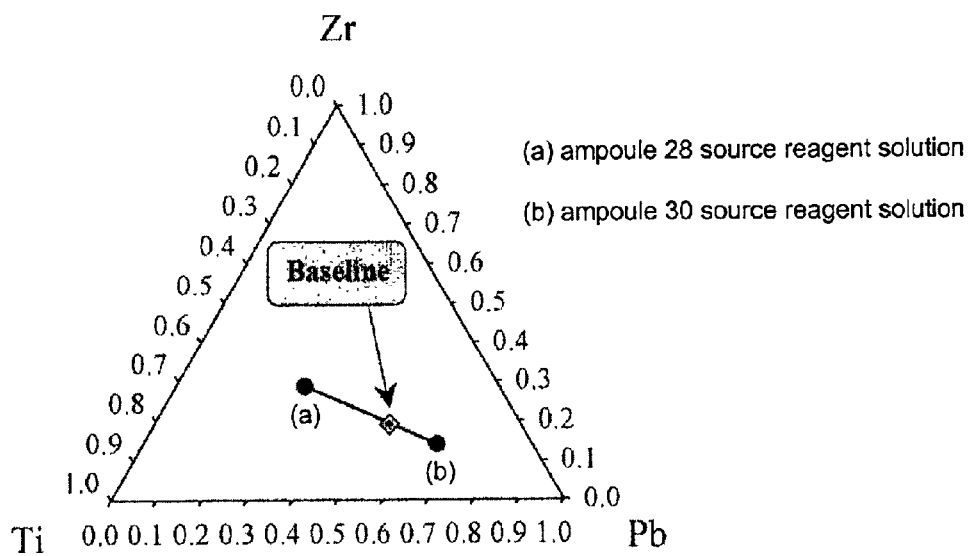
FIG. 3 is a graphical representation of the baseline chemistry for two source reagent precursor mixtures.

As shown in FIG. 3, in some embodiments, the metalorganic precursor composition space includes lead, zirconium and titanium concentrations in the range of 5–95%. In one embodiment, the lead concentration is in the range of about 28%–65%, the zirconium concentration is in the range of about 14%–29%, and the titanium concentration is in the range of about 20%–43%. The lead precursor, titanium precursor and zirconium precursor have combined concentration of about 0.05–0.5 M in solution and, more preferably, have a combined concentration of about 0.2–0.35 M in solution. In one preferred embodiment, ampoules 28 and 30 each contains Pb(thd)$_2$(pmdeta), Zr(OiPr)$_2$(thd)$_2$, and Ti(OiPr)$_2$(thd)$_2$ with the following respective component metal concentrations:

TABLE 1

| | Ampoule | Pb Concentration (Molar) | Zr Concentration (Molar) | Ti Concentration (Molar) | Total Concentration (Molar) |
|---|---|---|---|---|---|
| Low Pb | 28 | 0.090 (28.6%) | 0.090 (28.6%) | 0.135 (42.8%) | 0.315 |
| High Pb | 30 | 0.205 (64.9%) | 0.045 (14.2%) | 0.066 (20.9%) | 0.316 |

In this embodiment, the reagent solution flow from ampoule 28 is approximately 65–82 mg/minute and the reagent solution flow from ampoule 30 is approximately 118–135 mg/minute for a total reagent solution flow of approximately 200 mg/minute.

After the reagent solutions have been mixed to form the precursor solution, the precursor solution is vaporized to form a precursor vapor (step 66). For the above-described baseline chemistry, the vaporizer temperature preferably is in the range of 180–210° C. and, more preferably, is about 190° C. The jackets, lids and other feedthrough apparatus preferably are maintained at the same temperature as vaporizer 16. The carrier gas transports the precursor vapor from vaporizer 16. In one embodiment, the carrier flow through vaporizer 16 is about 250 sccm. Initially, the precursor vapor is diverted to the evacuation system 52 (step 68).

Figure 4A:
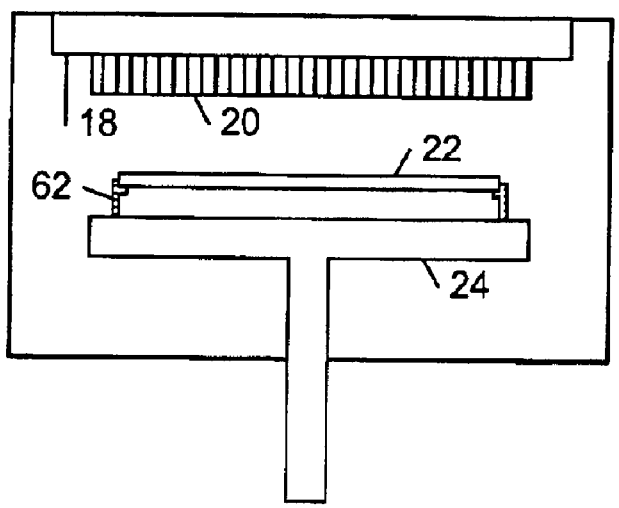
FIG. 4A is a diagrammatic representation of a substrate being supported above a heated susceptor during a preheating period prior to the deposition of a PZT film on the substrate.
Figure 4B:
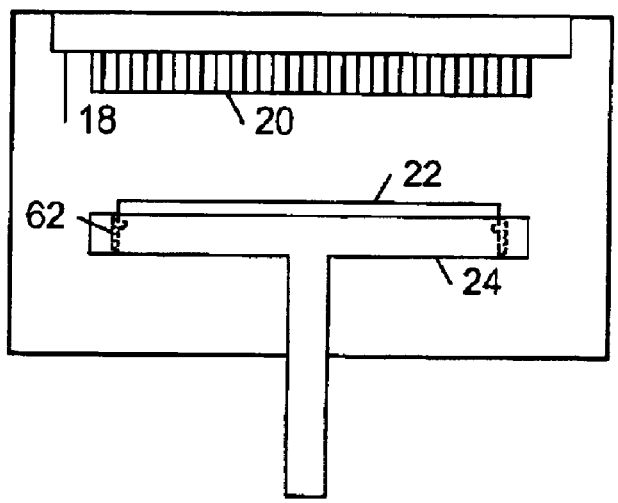
FIG. 4B is a diagrammatic representation of the substrate of FIG. 4A disposed on the heated susceptor during a heating period prior to the deposition of a PZT film on the substrate.

Referring to FIGS. 4A and 4B, while the precursor vapor is being diverted to the evacuation system 52, substrate 22 is loaded onto lift pins 62 inside CVD chamber 12 (step 70). Lift pins 62 are configured to support substrate 22 above heated susceptor 24 during a preheating period in which substrate 22 is heated indirectly by susceptor 24 (e.g., by radiative and convective heating) (step 72). The preheating process allows substrate 22 to be heated gradually and, thereby, substantially reduces the incidence of thermal shock that otherwise might occur if substrate 22 were placed immediately into contact with susceptor 24. Such thermal shock might cause substrate 22 to break inside CVD chamber 12, in which case CVD chamber 12 would have to be opened and cleaned, a process that substantially reduces the productivity of the system. In one embodiment, the preheating period is about 5–30 seconds long.

After the preheating period has expired (step 74), substrate 22 is lowered into contact with heated susceptor 24 (step 76). In general, substrate 22 may be heated to a final processing temperature of 450–610° C., which is a suitable temperature range for forming a PZT film from the metal constituents of the precursor vapor. In one embodiment, during a heating period, susceptor 24 is set to a temperature of about 640–650° C. and heats substrate 22 to a final processing temperature of approximately 600–609° C. In one embodiment, the heating period is about 30–60 seconds long or longer.

After the heating period has expired (step 78), the PZT precursor vapor is mixed with oxidizing co-reactant gases (e.g., $O_2$, $O_3$, $N_2O$, or a combination of one or more of these gases) and the gas/vapor mixture is introduced into CVD chamber 12 to form a PZT film on the exposed surface of substrate 22 (step 80) until a desired PZT film thickness has been deposited (step 81). During the PZT deposition, CVD chamber 12 preferably is maintained at a pressure of about 0.5–10 torr and, more preferably, is maintained at a pressure of about 4 torr. It has been observed that the PZT film deposition rate increases with chamber pressure over the pressure range of 0.5–10 torr. Indeed, the deposition rates in this pressure range are substantially greater than the deposition rates that are achieved at lower chamber pressures (e.g., below 1 torr). Under the above-described preferred deposition conditions, the deposition rate is approximately 12–20 nm/minute and, in one embodiment, the deposition rate is about 16 nm/minute.

In general, the film composition should be tuned so that it falls within the self-correcting Pb composition regime. In addition, within the self-correcting region, the film properties vary significantly with precursor concentration despite the fact that the film remains stoichiometric. Consequently, within the self-correcting regime, the Pb/(Zr+Ti) (gas) composition should be chosen to optimize film properties. The range of Pb/(Zr+Ti) ratios corresponding to the self-correcting region are dependent on various process conditions, including pressure, substrate temperature, and oxidizer gases.

Figure 5:
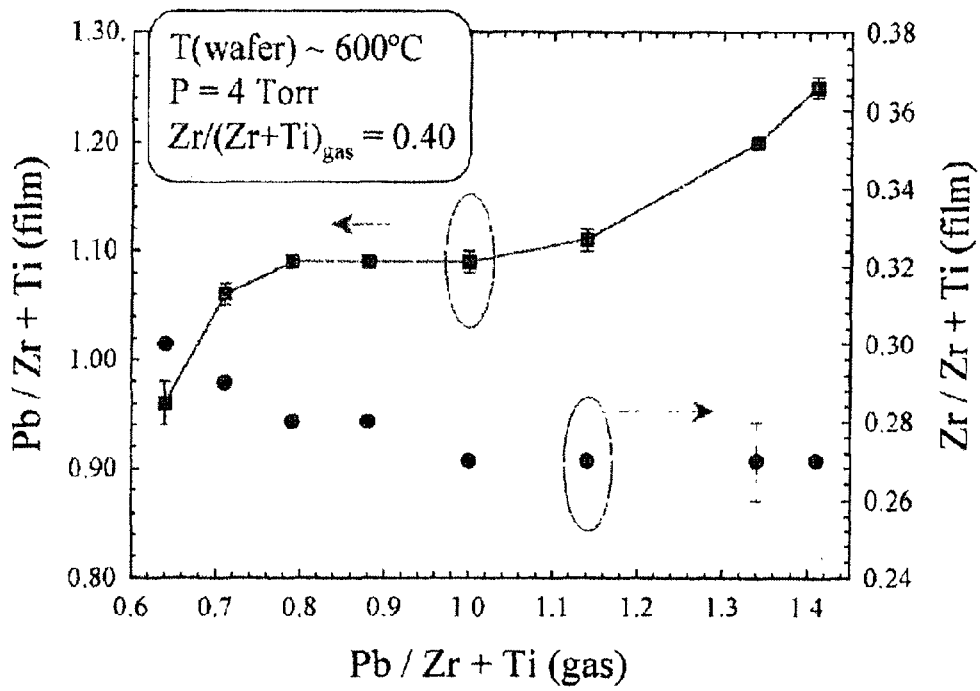
FIG. 5 is a graph of the $Pb/(Ti+Zr)$ ratio and the $Zr/(Zr+Ti)$ ratio in PZT films formed by the method of FIG. 2 plotted as a function of the precursor vapor $Pb/(Ti+Zr)$ ratio.

As shown in FIG. 5, for the above-described preferred baseline chemistry and process conditions (which are summarized below in Table 2), a process window yielding single-phase PZT exists that corresponds to a self-correcting Pb composition regime that is characterized by precursor vapor Pb/(Zr+Ti) (gas) ratios between 0.8 and 1.3. Consequently, the starting precursor solutions are chosen so that this range of compositions is easily accessible. As shown, within this process window, the Zr concentration is substantially independent of the Pb ratio. In general, the resulting PZT films become rougher beyond the self-correcting regime where excess Pb is incorporated into the PZT film. It has been observed that within the self-correcting lead composition regime precursor vapor Pb/(Zr+Ti) (gas) ratios between 1.00 and 1.07 produce PZT films with optimal electrical properties. Accordingly, during deposition, the precursor solution (liquid) Pb/(Zr+Ti) ratio preferably is between 0.3 and 3.0 and, more preferably, is between 0.8 and 1.3 and, still more preferably, is between 1.00 and 1.07. Under these conditions, the precursor solution (liquid) Zr/(Zr+Ti) ratio preferably is between 0.05 and 0.70 and, more preferably, between 0.30 and 0.40. In one embodiment, the precursor solution (liquid) Zr/(Zr+Ti) ratio is 0.40, which translates to a Zr/(Zr+Ti) ratio of about 0.25 to 0.27 in the resulting PZT film. In the embodiments described above in connection with Table 1, the precursor mixtures in source reagent ampoules 28, 30 have the same Zr/(Zr+Ti) ratio, but have different Pb/(Ti+Zr) ratios, with one source reagent ampoule having a relatively high Pb/(Ti+Zr) ratio and the other source reagent ampoule having a relatively low Pb/(Ti+Zr) ratio.

Figure 6:
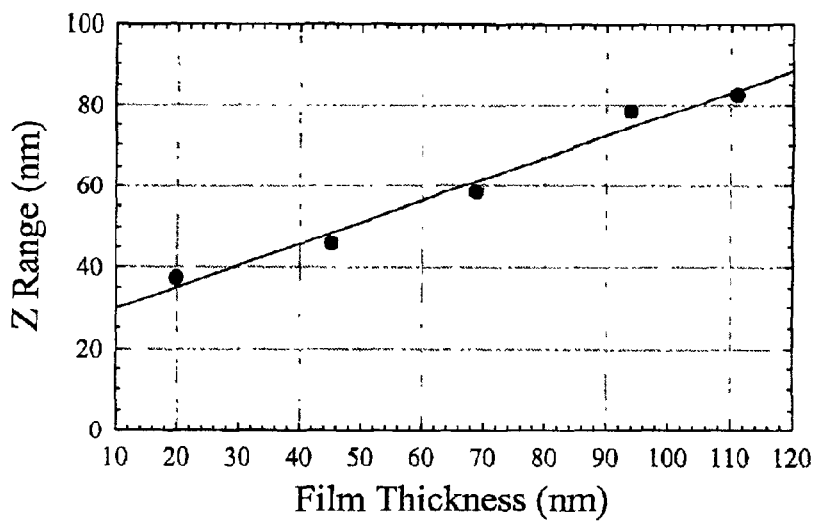
FIG. 6 is a graph of z-range plotted as a function of PZT film thickness as measured by atomic force microscopy (AFM) for PZT films deposited in accordance with the baseline chemistry and process conditions described herein.

The baseline process yields 70 nm films with an RMS roughness of 8 nm and a z-range of 58 nm, as measured by atomic force microscopy (AFM). The dependence of RMS roughness on PZT film thickness is illustrated in FIG. 6.

TABLE 2

| | |
|---|---|
| Heater Temperature | 640° C. |
| Wafer Temperature | ~600° C. |
| Pre-Deposition Time on Chuck | 30 sec on-pins/60 sec on-heater |
| He Carrier Flow Through Vaporizer | 250 sccm |
| Oxygen Flow | 1000 sccm |
| Ar Purge Flow | 250 sccm |
| Ar Push Gas Pressure on Precursor Ampoules | 60 psi |
| Vaporizer Temperature | 190° C. |
| Jackets/Lid/Feedthrough Temperatures | 190° C. |
| Showerhead to Heater Spacing | 350 mils |
| Chamber Pressure | 4 Torr |
| Low Pb Precursor Flow | 65 to 82 mg/min |
| High Pb Precursor Flow | 118 to 135 mg/min |
| Total Precursor Flow | 200 mg/min |
| Pb/(Zr + Ti) (in liquid) | 1.00 to 1.14 |
| Zr/(Zr + Ti) (in liquid) | 0.40 |
| Deposition Rate | ~160 Å/min |
| Substrate | Ir (100 nm)/$Si_3N_4$/$SiO_2$/Si and $IrO_x$ (50 nm)/Ir (50 nm)/$Si_3N_4$/$SiO_2$/Si |

In addition to proper selection of the precursor solution Pb/(Zr+Ti) ratios, other process parameters have been found to improve the characteristics of the self-correcting Pb composition regime, even at low processing temperatures. For example, it has been discovered that the process pressure and the composition of the oxidizing co-reactant gas have a substantial impact on the range of the self-correcting Pb composition regime and, consequently, on the degree to which the process temperature may be reduced. In particular, a process pressure of 0.5–4 torr and, more preferably 2 torr, and the addition to the oxidizing co-reactant gas flow of $N_2O$ in a concentration of 5–100% and, more preferably 50–75%—with the remaining portion of the co-reactant gas being $O_2$, in this embodiment—provides a PZT film deposition process with a relatively large self-correcting Pb composition regime, even at a wafer temperature of approximately 575° C.

Figure 7:
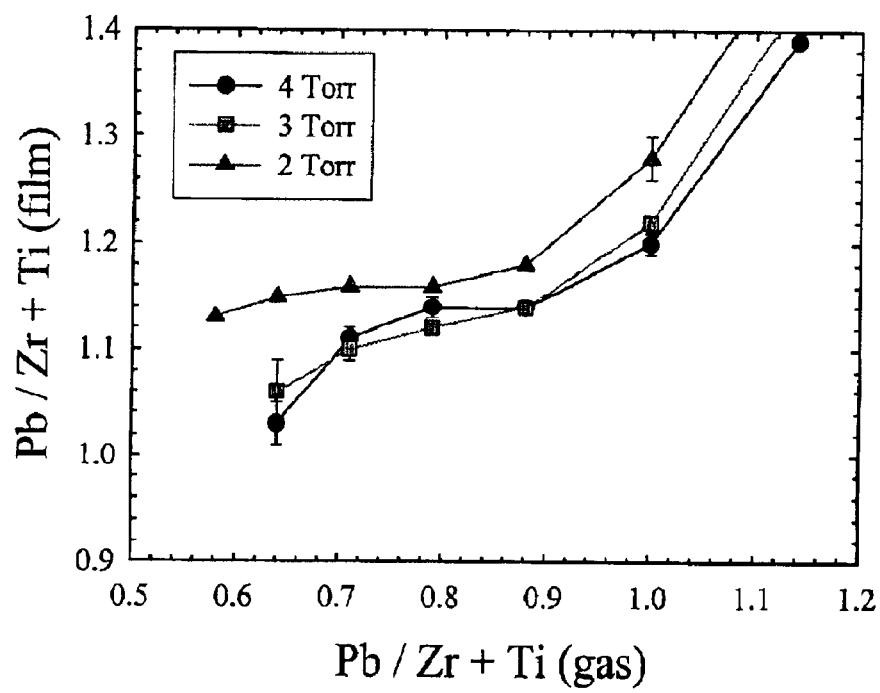
FIG. 7 is a graph of the $Pb/(Ti+Zr)$ ratio in PZT films formed by the method of FIG. 2 plotted as a function of the precursor vapor $Pb/(Ti+Zr)$ ratio for four different CVD chamber pressures.
Figure 8:
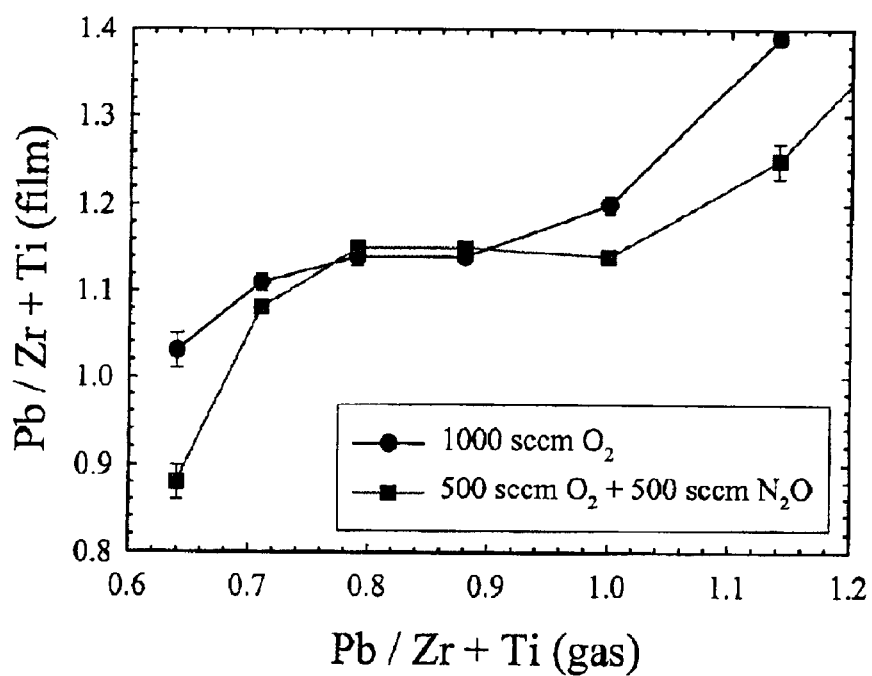
FIG. 8 is a graph of the $Pb/(Ti+Zr)$ ratio in PZT films formed by the method of FIG. 2 plotted as a function of the precursor vapor $Pb/(Ti+Zr)$ ratio for an oxidizer gas comprising 100% $O_2$ and an oxidizer gas comprising 50% $O_2$ and 50% $N_2O$.
Figure 9:
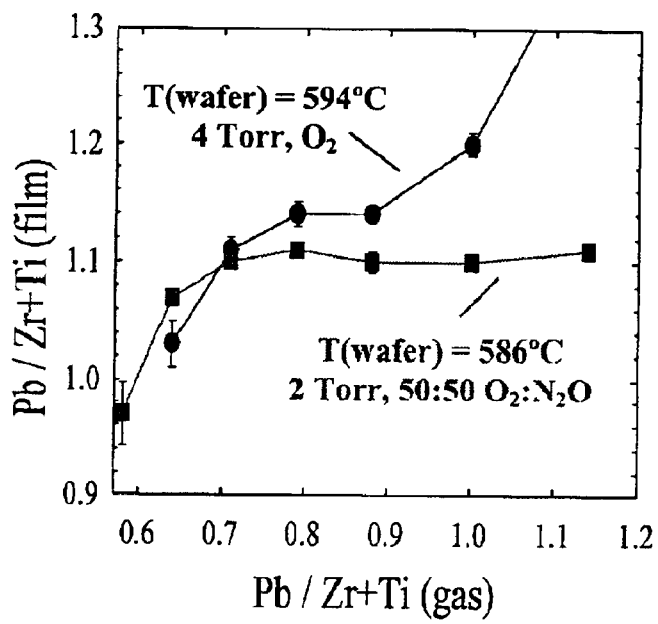
FIG. 9 is a graph of the $Pb/(Ti+Zr)$ ratio in PZT films formed by the method of FIG. 2 plotted as a function of the precursor vapor $Pb/(Ti+Zr)$ ratio at a CVD chamber pressure of 2 torr and an oxidizer gas comprising 50% $O_2$ and 50% $N_2O$ for two different wafer temperatures and constant susceptor temperature of 630° C.
Figure 10:
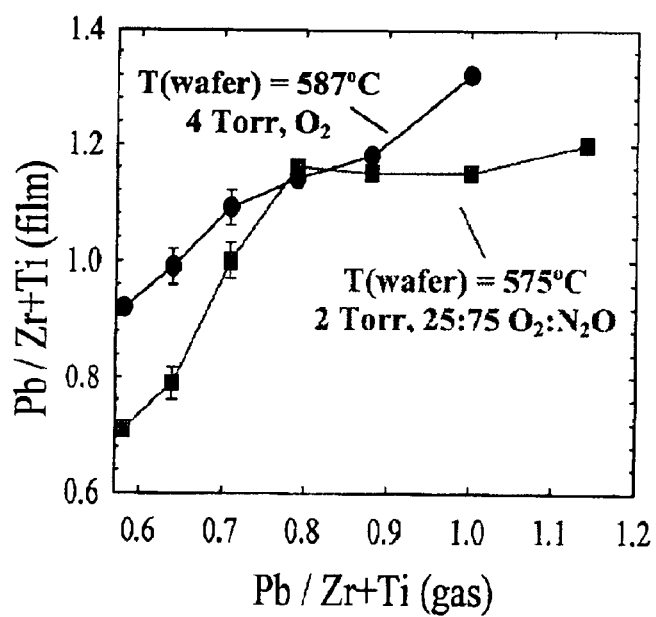
FIG. 10 is a graph of the $Pb/(Ti+Zr)$ ratio in PZT films formed by the method of FIG. 2 plotted as a function of the precursor vapor $Pb/(Ti+Zr)$ ratio at a CVD chamber pressure of 2 torr and an oxidizer gas comprising 25% $O_2$ and 75% $N_2O$ for two different wafer temperatures and constant susceptor temperature of 620° C.

FIGS. 7, 8, 9 and 10 graphically illustrate the effects of process pressure and $N_2O$ on the relative size of the self-correcting Pb composition regime. As shown in FIG. 7, for a constant wafer heater temperature of 630° C., the self-correcting Pb composition regime extends to lower Pb/(Ti+Zr) (gas) values (and the range of the self-correcting regime increases) as the pressure decreases. As shown in FIG. 8, the self-correcting Pb composition regime extends to higher Pb/(Ti+Zr) (gas) values (and the range of the self-correcting regime increases) when $N_2O$ is added to the oxidizing co-reactant gas flow. As shown in FIGS. 9 and 10, by combining a low process pressure with an oxidizing co-reactant gas comprising $N_2O$, the range of the self-correcting Pb composition regime may be increased significantly, improving the robustness of the deposition process. Two exemplary baseline chemistry and process condition combinations that incorporate these features are summarized below in Tables 3 and 4.

TABLE 3

| | |
|---|---|
| Heater Temperature | 630° C. |
| Wafer Temperature | ~586° C. |
| Pre-Deposition Time on Chuck | 30 sec on-pins/60 sec on-heater |
| He Carrier Flow Through Vaporizer | 250 sccm |
| Oxygen Flow | 500 sccm |
| $N_2O$ Flow | 500 sccm |
| Ar Purge Flow | 250 sccm |
| Ar Push Gas Pressure on Precursor Ampoules | 60 psi |
| Vaporizer Temperature | 190° C. |
| Jackets/Lid/Feedthrough Temperatures | 190° C. |
| Showerhead to Heater Spacing | 350 mils |
| Chamber Pressure | 2 Torr |
| Low Pb Precursor Flow | 82 to 115 mg/min |
| High Pb Precursor Flow | 85 to 118 mg/min |
| Total Precursor Flow | 200 mg/min |
| Pb/(Zr + Ti) (in liquid) | 0.79 to 1.00 |
| Zr/(Zr + Ti) (in liquid) | 0.40 |
| Deposition Rate | ~107 Å/min |
| Substrate | Ir (100 nm)/$Si_3N_4$/$SiO_2$/Si and $IrO_x$ (50 nm)/Ir (50 nm)/$Si_3N_4$/$SiO_2$/Si |

TABLE 4

| | |
|---|---|
| Heater Temperature | 620° C. |
| Wafer Temperature | ~575° C. |
| Pre-Deposition Time on Chuck | 30 sec on-pins/60 sec on-heater |
| He Carrier Flow Through Vaporizer | 250 sccm |
| Oxygen Flow | 250 sccm |
| $N_2O$ Flow | 750 sccm |
| Ar Purge Flow | 250 sccm |
| Ar Push Gas Pressure on Precursor Ampoules | 60 psi |
| Vaporizer Temperature | 190° C. |
| Jackets/Lid/Feedthrough Temperatures | 190° C. |
| Showerhead to Heater Spacing | 350 mils |
| Chamber Pressure | 2 Torr |
| Low Pb Precursor Flow | 82 to 115 mg/min |
| High Pb Precursor Flow | 85 to 118 mg/min |
| Total Precursor Flow | 200 mg/min |
| Pb/(Zr + Ti) (in liquid) | 0.79 to 1.00 |
| Zr/(Zr + Ti) (in liquid) | 0.40 |
| Deposition Rate | ~96 Å/min |
| Substrate | Ir (100 nm)/$Si_3N_4$/$SiO_2$/Si and $IrO_x$ (50 nm)/Ir (50 nm)/$Si_3N_4$/$SiO_2$/Si |

After a PZT film having a desired thickness is deposited on substrate 22 (step 81), the PZT precursor vapor again is diverted to evacuation system 52 (step 82). Following deposition, substrate 22 remains within CVD chamber 12 for a post-deposition waiting period before it is transported from CVD chamber 12 into a buffer chamber. In one embodiment, the post-deposition waiting period is about 5 seconds, or longer.

Other embodiments are within the scope of the claims. For example, in some embodiments, a single source reagent ampoule containing a complete, premixed solution of lead, titanium and zirconium precursors may be used. In other embodiments, three or more complete, premixed source reagent solutions may be mixed together to define the metalorganic composition space.

Still other embodiments are within the scope of the claims.

What is claimed is:

1. A method of forming a ferroelectric PZT film on a substrate, comprising:
   metering from a source reagent ampoule a selected quantity of a premixed liquid source reagent solution comprising a mixture of a lead precursor, a titanium precursor and a zirconium precursor in a solvent medium;
   vaporizing the metered source reagent solution to form a precursor vapor; and
   introducing the precursor vapor into a chemical vapor deposition chamber containing the substrate.

2. The method of claim 1, wherein the zirconium precursor comprises $Zr(OiPr)_2(thd)_2$ or $Zr(thd)_4$ or $Zr(OtBu)_2(thd)_2$.

3. The method of claim 1, wherein the lead precursor is $Pb(thd)_2(pmdeta)$, the zirconium precursor is $Zr(OiPr)_2(thd)_2$, and the titanium precursor is $Ti(OiPr)_2(thd)_2$.

4. The method of claim 1, wherein the lead precursor, the titanium precursor and the zirconium precursor have a combined concentration between about 0.05 M and about 1.0 M in solution.

5. The method of claim 1, wherein the source reagent solution is characterized by lead, zirconium and titanium concentrations between about 5% and 95%.

6. The method of claim 1, further comprising introducing into the chemical vapor deposition chamber an oxidizing co-reactant gas comprising 5–100% $N_2O$.

7. The method of claim 6, wherein the oxidizing co-reactant gas comprises 50–75% $N_2O$.

8. The method of claim 1, further comprising introducing into the chemical vapor deposition chamber an oxidizing co-reactant gas comprising one or more of the following gases: $N_2O$, $O_2$, and $O_3$.

9. The method of claim 1, wherein the solvent medium comprises an octane-based solvent.

10. The method of claim 1, wherein the source reagent solution is vaporized at a temperature in the range of about 180–210° C.

11. The method of claim 1, further comprising maintaining the chemical vapor deposition chamber at a pressure in the range of about 0.5–10 torr during deposition.

12. The method of claim 11, wherein the chemical vapor deposition chamber is maintained at a pressure in the range of about 0.5–4 torr during deposition.

13. The method of claim 12, wherein the chemical vapor deposition chamber is maintained at a pressure of approximately 4 torr during deposition.

14. The method of claim 1, wherein the source reagent solution is selected to obtain a precursor vapor having a Zr/(Zr+Ti) ratio in the range of about 0.05–0.70.

15. The method of claim 1, wherein the source reagent solution is selected to obtain a precursor vapor having a Pb/(Zr+Ti) ratio in the range of about 0.3–3.0.

16. The method of claim 1, further comprising preheating the substrate during a preheating period.

17. The method of claim 16, wherein the preheating period is about 5–30 seconds long.

18. The method of claim 16, further comprising disposing the preheated substrate on a heated susceptor during a heating period prior to formation of the PZT film on the substrate.

19. The method of claim 18, wherein the heating period is about 30–60 seconds long or longer.

20. The method of claim 1, further comprising providing a flow of a purge gas to reduce film depositions on susceptor and chamber wall surfaces.

21. A method of forming a ferroelectric PZT film on a substrate, comprising:
   providing a first premixed source reagent solution comprising a mixture of a lead precursor, a titanium precursor and a zirconium precursor in a solvent medium;
   providing a second premixed source reagent solution comprising a second mixture of the lead precursor, the titanium precursor and the zirconium precursor in the solvent medium, wherein the first source reagent mixture is different from the second source reagent mixture;

mixing the first and second reagent solutions to form a precursor solution;

vaporizing the precursor solution to form a precursor vapor; and introducing the precursor vapor into a chemical vapor deposition chamber containing the substrate.

22. The method of claim 21, wherein the first and second source reagent solutions are characterized by a lead concentration in a range of about 28–65%, a zirconium concentration in a range of about 14–29%, and a titanium concentration in a range of about 20–43%.

23. A method of forming a ferroelectric PZT film on a substrate, comprising:

introducing a substrate into a chemical vapor deposition chamber;

preheating the substrate during a preheating period;

after the preheating period, disposing the substrate on a heated susceptor during a heating period;

metering from a source reagent ampoule a selected quantity of a premixed liquid source reagent solution comprising a mixture of a lead precursor, a titanium precursor and a zirconium precursor in a solvent medium;

vaporizing the metered source reagent solution to form a precursor vapor; and introducing the precursor vapor into the chemical vapor deposition chamber to form a ferroelectric PZT film on the heated substrate.

24. The method of claim 23, wherein the substrate is preheated by supporting the substrate above the heated susceptor during the preheating period.

25. The method of claim 23, further comprising providing a flow of a purge gas to reduce film depositions on susceptor and chamber wall surfaces.

26. A method of forming a ferroelectric PZT film on a substrate, comprising:

introducing a substrate into a chemical vapor deposition chamber;

preheating the substrate during a preheating period;

after the preheating period, disposing the substrate on a heated susceptor during a heating period;

metering from a first liquid source a selected quantity of a first premixed liquid source reagent solution comprising a mixture of a lead precursor, a titanium precursor and a zirconium precursor in a solvent medium;

metering from a second liquid source a selected quantity of a second premixed liquid source reagent solution comprising a second mixture of the lead precursor, the titanium precursor and the zirconium precursor in the solvent medium, wherein the first source reagent mixture is different from the second source reagent mixture;

vaporizing the metered first and second source reagent solutions to form a precursor vapor; and introducing the precursor vapor into the chemical vapor deposition chamber to form a ferroelectric PZT film on the heated substrate.

27. The method of claim 26, further comprising mixing the first and second premixed liquid source reagent solutions to form a precursor mixture and, subsequently, vaporizing the precursor mixture to form the precursor vapor.

28. The method of claim 26, wherein the first and second source reagent solutions are characterized by a lead concentration in a range of about 28–65%, a zirconium concentration in a range of about 14–29%, and a titanium concentration in a range of about 20–43%.

* * * * *